United States Patent
Subramanian et al.

(10) Patent No.: US 9,064,595 B2
(45) Date of Patent: *Jun. 23, 2015

(54) STORAGE OF READ THRESHOLDS FOR NAND FLASH STORAGE USING LINEAR APPROXIMATION

(71) Applicant: SK hynix memory solutions inc., San Jose, CA (US)

(72) Inventors: Arunkumar Subramanian, San Jose, CA (US); Xiangyu Tang, San Jose, CA (US); Jason Bellorado, San Jose, CA (US); Lingqi Zeng, San Jose, CA (US); Frederick K. H. Lee, Mountain View, CA (US)

(73) Assignee: SK hynix memory solutions inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/553,745

(22) Filed: Nov. 25, 2014

(65) Prior Publication Data

US 2015/0085572 A1 Mar. 26, 2015

Related U.S. Application Data

(63) Continuation of application No. 13/852,934, filed on Mar. 28, 2013, now Pat. No. 8,923,066.

(60) Provisional application No. 61/621,914, filed on Apr. 9, 2012.

(51) Int. Cl.
*G11C 16/26* (2006.01)
*G11C 29/00* (2006.01)

(52) U.S. Cl.
CPC .................................... *G11C 16/26* (2013.01)

(58) Field of Classification Search
CPC ........................... G11C 16/26; G11C 16/0483
USPC ............. 365/185.03, 185.09, 185.12, 185.11, 365/185.17, 185.21; 714/721, 773, 763
See application file for complete search history.

(56) References Cited

U.S. PATENT DOCUMENTS

| 7,975,192 B2 | 7/2011 | Sommer et al. |
| 8,923,066 B1 * | 12/2014 | Subramanian et al. .. 365/185.21 |
| 2014/0169102 A1 * | 6/2014 | Sun et al. ................. 365/185.24 |

* cited by examiner

*Primary Examiner* — Andrew Q Tran
(74) *Attorney, Agent, or Firm* — Van Pelt, Yi & James LLP

(57) ABSTRACT

A first read threshold associated with a first page in a block and a second read threshold associated with a second page in the block are received, where the first page has a first page number and the second page has a second page number. A slope and a y intercept are determined based at least in part on the first read threshold, the second read threshold, the first page number, and the second page number. The slope and the y intercept are stored with a block identifier associated with the block.

22 Claims, 9 Drawing Sheets

STORAGE OF READ THRESHOLDS FOR NAND FLASH STORAGE USING LINEAR APPROXIMATION

CROSS REFERENCE TO OTHER APPLICATIONS

This application is a continuation of co-pending U.S. patent application Ser. No. 13/852,934, entitled STORAGE OF READ THRESHOLDS FOR NAND FLASH STORAGE USING LINEAR APPROXIMATION filed Mar. 28, 2013 which is incorporated herein by reference for all purposes, which claims priority to U.S. Provisional Patent Application No. 61/621,914 entitled LOOK-UP TABLES FOR NAND FLASH STORAGE THRESHOLDS filed Apr. 9, 2012 which is incorporated herein by reference for all purposes.

BACKGROUND OF THE INVENTION

Unlike magnetic storage systems, such as hard disk drive systems, NAND Flash storage systems require a read threshold to be specified when performing a read. In the case of single level cell (SLC) NAND, cells in a page which have a voltage below the specified read threshold are interpreted to have a first stored value (e.g., a 1) and cells in the page which have a voltage above the specified read threshold are interpreted to have a second stored value (e.g., a 0). The number of incorrectly interpreted cells (i.e., errors) is thus dependent upon the read threshold specified. It is desirable to store read thresholds for pages because finding or estimating a "good" read threshold usually require multiple reads, which is laborious if it is done for each page read request. However, existing storage techniques may have a poor tradeoff between memory requirements and the quality of the read values returned. New techniques for storing read thresholds which have a better tradeoff between storage requirements and quality of returned values would be desirable.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
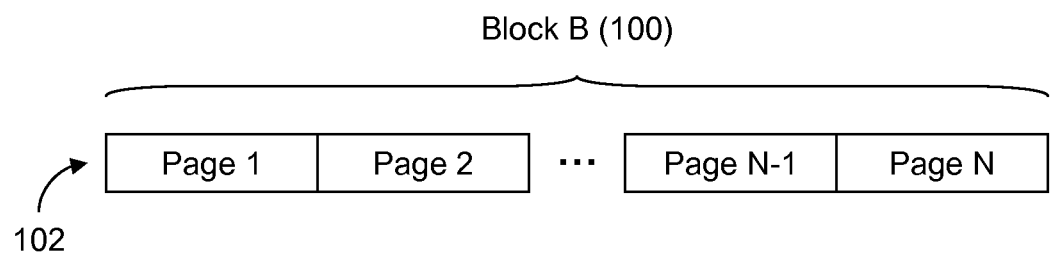
FIG. 1 is a diagram showing a single level cell (SLC) embodiment of pages in a block in solid state storage and associated distributions.
Figure 1:
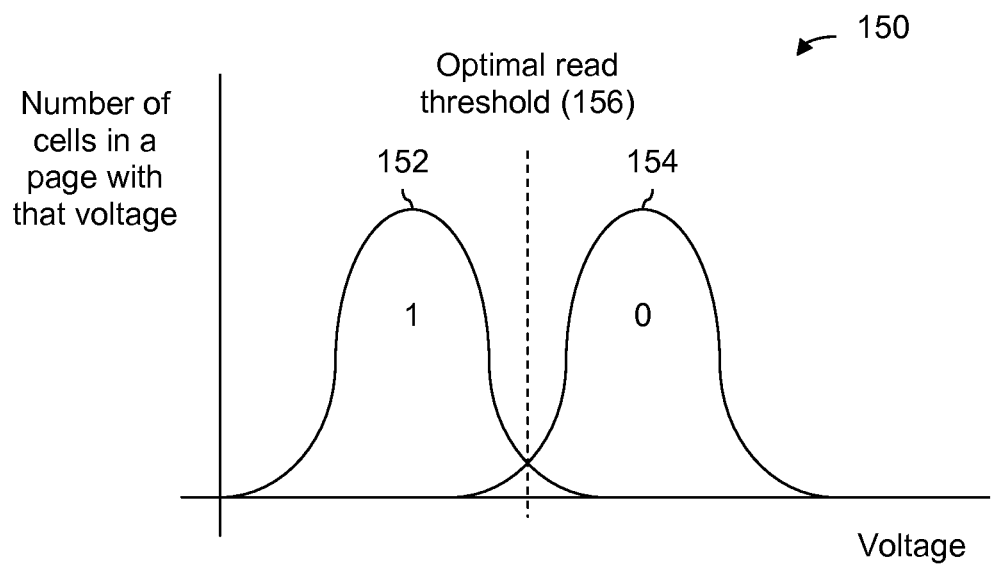

FIG. 1 is a diagram showing a single level cell (SLC) embodiment of pages in a block in solid state storage and associated distributions. In the example shown, the solid state storage is NAND Flash and the cells are SLC type cells. There are various types of cells which store various numbers of levels or bits. Multi level cells (MLC) store 2 bits, tri level cells (TLC) store 3 bits, and xLC cells store any number of bits (e.g., xLC includes SLC, MLC, TLC, and so on).

Cells (not shown) are grouped together in pages. Some types of access to NAND Flash are performed at the page level. For example, a single cell in a page cannot be read without reading all cells in that page. Pages, in turn, are grouped into blocks. Block 100 includes N pages (102) numbered 1 through N. In a typical example, there are 64 or 128 pages per block. Some types of access to NAND Flash are performed at the block level. For example, erase operations can only be performed at the block level. An individual page in a block, for example, cannot be erased without also erasing other pages in that block. Although only one block is shown in FIG. 1, a solid state storage system typically includes more than one block and block 100 has a block number (i.e., B) to uniquely identify it.

The arrangement of pages 102 within block 100 shown is merely exemplary and is not intended to be limiting. For example, although each page is shown as a single, unbroken unit and the pages are arranged in ascending order from left to right, any (e.g., physical or actual) layout or organization may be used. For example, pages may be physically interleaved with each other or "striped" when actually stored on solid state storage.

Diagram 150 shows distribution functions for two groups of cells in a page. For example, diagram 150 may be associated with page 1 in block B; other pages may have slightly different distributions. The x-axis of diagram 150 shows voltage (e.g., stored by cells in page 1 in block B) and the y-axis shows the number of cells in the page with that voltage. Distribution 152 is associated with cells that actually store a 1 (e.g., when they were written, a 1 was intended to be written) and distribution 154 is associated with cells that actually store a 0. In a perfect system, all cells in the page with a 1 would store the same first voltage and all cells in the page with a 0 would store the same second voltage, resulting in two delta functions. However, because of variations in the stored voltages, distributions 152 and 154 result.

Depending upon the quality of the dielectric of the NAND Flash storage (i.e., how "leaky" the NAND Flash storage is), distributions 152 and 154 shift over time. In general, data which has been stored for a longer period of time will tend to experience more voltage loss than data which has been stored for a shorter period of time, and a cell which has experienced more program/erase cycles will tend to be "leakier" than a cell which has experienced fewer program/erase cycles.

The optimal read threshold (e.g., which minimizes bit-error-rate (BER)) associated with distributions 152 and 154 is at the crossing point (156) of the two distributions. Since distributions 152 and 154 are not typically known to a read processor, an estimate of optimal read threshold 156 is sometimes made, for example using a read based technique that includes reading the page at one or more read thresholds and analyzing the cell read values that are returned for those read thresholds. The technique described herein is agnostic of (optimal) read threshold estimation techniques and any technique may be used. The terms optimal read threshold estimate, optimal read threshold, read threshold estimate, and read threshold are used interchangeably herein.

Figure 2:
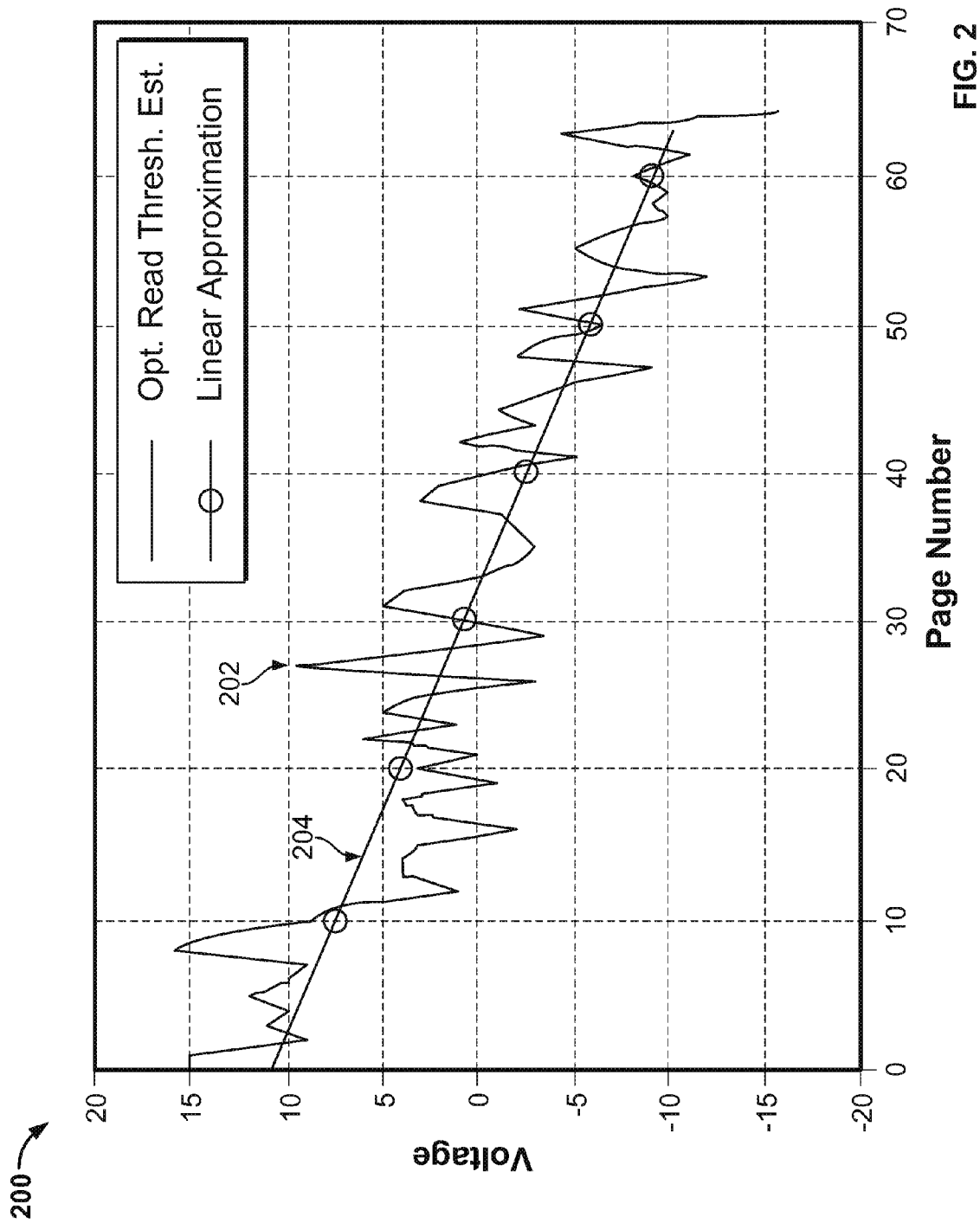
FIG. 2 is a diagram showing an embodiment of a plot of optimal read thresholds for pages in a block.

FIG. 2 is a diagram showing an embodiment of a plot of optimal read thresholds for pages in a block. In diagram 200, the x-axis is page number (sometimes referred to as a page offset) and the y-axis is voltage (e.g., because optimal read threshold estimates are, at least in this example, expressed in voltage). Optimal read threshold estimates are generated for each of the N pages (102) in block 100 in FIG. 1 using any of a variety of techniques (e.g., using a read based technique) and are shown as plot 202. It is observed that plot 202 is generally linear in form and linear approximation 204 may be made using any number of data points from plot 202. For example, the slope (m) and the y intercept (c) of linear approximation 204 may be calculated using n data points:

$$m = \frac{\left(\sum_{i=1}^{n} x_i y_i\right) - 1/n\left(\sum_{i=1}^{n} x_i\right)\left(\sum_{i=1}^{n} y_i\right)}{\left(\sum_{i=1}^{n} x_i^2\right) - 1/n\left(\sum_{i=1}^{n} x_i\right)^2} ; \text{ and} \quad (1)$$

$$c = \frac{1}{n}\left(\sum_{i=1}^{n} y_i - m\sum_{i=1}^{n} x_i\right) \quad (2)$$

where n is any number.

Any line can be recreated given its slope and y intercept. The slope and y intercept for linear approximation 204 may thus be determined and saved and linear approximation 204 can be regenerated from those two stored values. Returning to FIG. 1, this means that a single slope and a single y intercept can be stored for all of the N pages (102) in block 100 and a read threshold for any of the N pages can be estimated (or, more generally, (re)generated) from the stored slope and y intercept given the page number. For example, suppose the y intercept of linear approximation 204 in FIG. 2 is 11 and the slope is −⅓. With the slope and y intercept for block B stored, if a read of page 21 in block B is desired, the slope and y intercept associated with block B may be accessed from storage and used to generate a read threshold to use to read page 21 in block B: (−⅓×21)+11=−7+11=4.

As described above, any number of data points in plot 202 may be used to generate linear approximation 204. In one example, the read thresholds used to generate linear approximation 204 are generated in real time and the amount of time required to generate one read threshold (via any read-based technique) is significant. In such applications, it may be desirable to use on the order of 2-6 read thresholds so that the system is not held up waiting for read thresholds to be generated.

In some embodiments, data points in plot 202 which are used to generate linear approximation 204 are distributed generally evenly throughout plot 202. If, for example, only 5 data points are used, it may be undesirable to use the read thresholds for pages 31-35 since they are clustered together in the middle of plot 202. It may be better (as an example) to use read thresholds at pages 1, 16, 32, 47, and 64 instead since they are more evenly distributed throughout plot 202 and may produce a better linear approximation.

Figure 3:
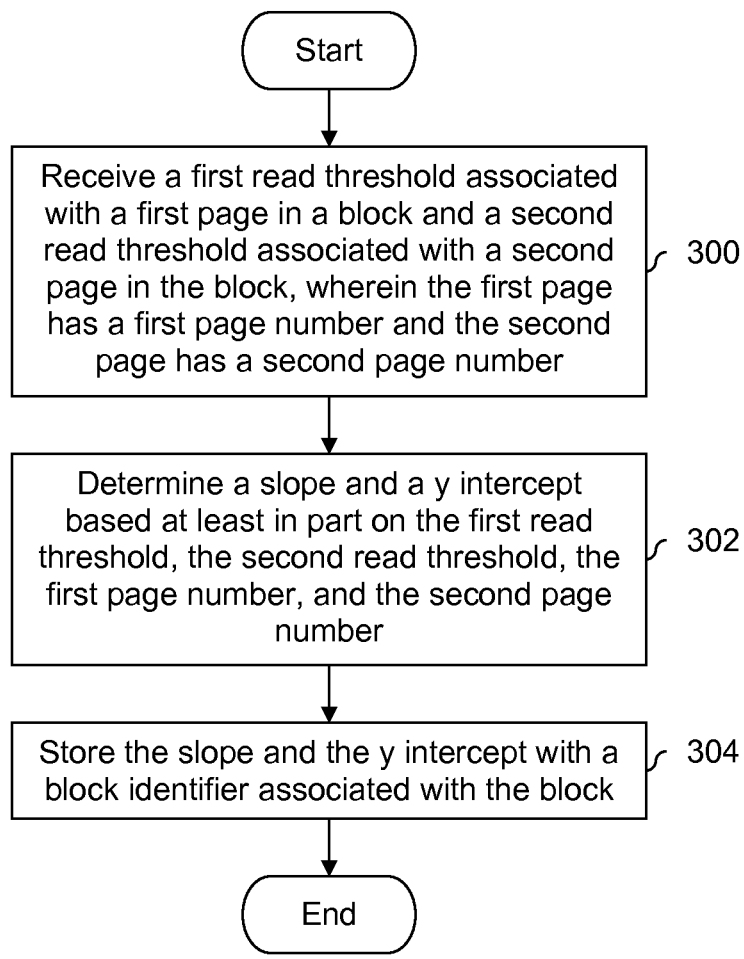
FIG. 3 is a flowchart illustrating an embodiment of a process for determining and storing a slope and y intercept.

FIG. 3 is a flowchart illustrating an embodiment of a process for determining and storing a slope and y intercept. At 300, a first read threshold associated with a first page in a block and a second read threshold associated with a second page in the block are received, wherein the first page has a first page number and the second page has a second page number. Step 300 is similar to obtaining two data points from plot 202 in FIG. 2.

At 302, a slope and a y intercept are determined based at least in part on the first read threshold, the second read threshold, the first page number, and the second page number. As described above, any number of data points may be used in performing linear approximation, so the determination at 302 may include additional page numbers and additional read thresholds if desired (e.g., if the number of data points used to determine a line is greater than or equal to 3). Step 302 is similar to determining the slope and y intercept of linear approximation 204 in FIG. 2.

At 304, the slope and the y intercept are stored with a block identifier associated with the block. For example, there may be multiple blocks and the stored block identifier is used to track which block the stored slope y intercept and slope are for. Some examples of a block identifier are a physical or logical address of a block. In some embodiments the slope and y intercept are stored on non-volatile memory so that the information is available even if the system is powered down and subsequently powered up. In some embodiments, an older slope or y intercept value is overwritten in storage at 304 with a newer slope or y intercept.

The process of FIG. 3 (or other processes described below) may be triggered by a variety of things (e.g., event driven or time driven). In one example, the process of FIG. 3 is performed as part of a background scan. In a background scan, optimal read thresholds are estimated for a predetermined set of pages in a block. (Any appropriate technique may be used to determine optimal read thresholds for the predetermined set of pages.) A slope and y intercept are then determined (e.g., using Equations (1) and (2), above) for the block using the data points associated with the predetermined set of pages, and the determined slope and y intercept are stored.

For example, when system first starts and a table of y intercepts and slopes is empty, the table is populated using a background scan.

In some embodiments, the slope of a linear estimate will change over time with the number of program/erase cycles. In some embodiments, a count of program/erase cycles is already kept (e.g., for wear leveling) and this count is used to trigger the process of FIG. 3 (or some other process described below) when the P/E count exceeds certain pre-defined values. The will cause the slope as well as the y intercept to be updated.

In some embodiments, the process of FIG. 3 (or some other process described below) is performed after a system has been powered down and powered up. When a system is powered down, clocks are not necessarily available, so a system may not be able to know how long it was powered down for. Since the optimal read thresholds may have changed significantly while the system was powered down (e.g., because the distributions may have shifted due to charge leakage (i.e., retention), but the system does not know how long it was powered down for and thus if the distributions have shifted significantly or not), a system may initiate the process of FIG. 3 after it is powered down and then powered up.

In some embodiments, the process of FIG. 3 (or some other process described below) may be terminated (e.g., early) if it is determined that newly calculated or stored slopes and/or y intercepts are very similar to the older, stored values which are being replaced or overwritten. For example, to continue the power down and power up example above, the amount of time a system was powered down may be relatively short so the optimal read thresholds have not changed significantly. As a result, new slopes and y intercepts are similar to older, stored values. This may be noted when FIG. 3 is performed on a first few blocks after power up, and the process may terminate (e.g., early) without continuing on to other blocks. In contrast, if the new values are different enough to warrant continued processing, the process will continue and will not terminate early.

In some embodiments, the process of FIG. 3 (or some other process described below) is performed in the event there is some indication that the quality of cell read values returned is poor. For example, an error correction decoder (e.g., a low-density parity-check (LDPC) decoder) may take too many iterations to decode pages in a given block. That may trigger the process of FIG. 3 to be repeated on that block. Or, the number of bit errors detected by a detector for a given block may be high. The process of FIG. 3 may be performed on that block in response. In another example, the error correction decoder may require more than one read to a page in a block in order to decode that page. In some embodiments this triggers update of the slope and y intercept for that block by performing the process of FIG. 3 on that block. In general, anything that indicates or corresponds to poor quality cell read values for a given block may cause (at least in some embodiments) the process of FIG. 3 to be performed on that block.

Figure 4:
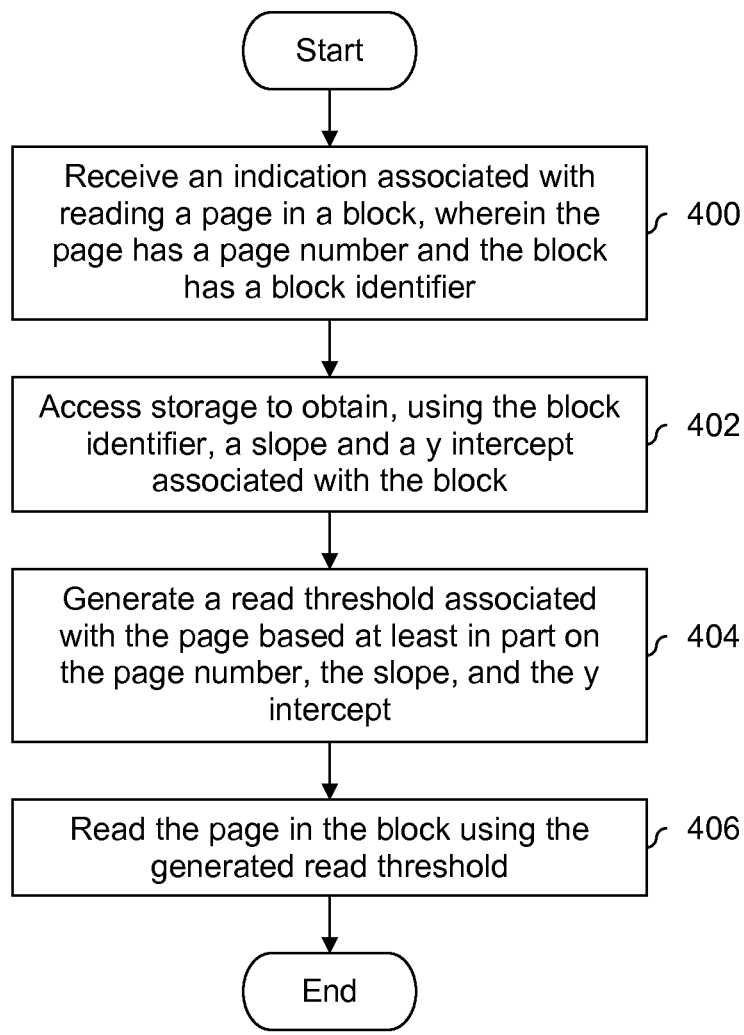
FIG. 4 is a flowchart illustrating an embodiment of a process for determining a read threshold using a stored slope and y intercept.

FIG. 4 is a flowchart illustrating an embodiment of a process for determining a read threshold using a stored slope and y intercept. At 400, an indication associated with reading a page in a block is received, wherein the page has a page number and the block has a block identifier. For example, a read of page 3 in block B in FIG. 1 may be desired.

At 402, storage is accessed to obtain, using the block identifier, a slope and a y intercept associated with the block. For example, slopes and y intercepts may be stored in a table on non-volatile memory. The block identifier may be passed to the table and the table returns the slope and y intercept corresponding to that block identifier.

At 404, a read threshold associated with the page is generated based at least in part on the page number, the slope, and the y intercept. For example, if the slope obtained at 402 is $-\frac{1}{3}$, the y intercept is 11, and the desired page number is 3, then the read threshold used is $(-\frac{1}{3} \times 3) + 11 = 10$. At 406, the page in the block is read using the generated read threshold. For example, a read threshold voltage of 11 is used to read page 3 in block B.

A naïve way of saving read thresholds is to store a read threshold for every page in a block. Referring back to FIG. 1, this means storing N read thresholds for just one block. This is expensive since non-volatile memory is required to store the read thresholds (as opposed to the more inexpensive volatile memory) since read thresholds need to be available even after a power down and power up. In contrast, storing a slope and y intercept for all of the N pages in a block requires much less memory. Although the quality of returned cell read values may be better when all read thresholds are stored for all pages, storing the y intercept and slope may be an acceptable tradeoff since the storage savings are significant and/or any difference in observed performance at the output of an error correction decoder may be acceptable or minimal (e.g., the error correction decoder may be able to compensate for at least some of the differences in the quality of returned cell read values using the two techniques).

Another less desirable way of storing read threshold values is to store a single read threshold for a block. All pages in the block would then use the same read threshold. Although this is memory efficient, the quality of cell read values returned is not as good as when a stored y intercept and slope are used to generate a read threshold for a given page in a block. For example, in FIG. 2, suppose a read threshold of 0 is stored for the block associated with plot 202. For the first page and the last page in the block shown, this is a difference of approximately $|15-0|=15$ and $|-16-0|=16$, respectively, between the optimal read threshold in plot 202 and the stored read threshold. In contrast, suppose a slope of $-\frac{1}{3}$ and a y intercept of 11 are stored. For a first page (e.g., page number=1), a read threshold of $(-\frac{1}{3} \times 1) + 11 = -\frac{1}{3} + 11 = 10\frac{2}{3}$ is generated and for a last page for a last page (e.g., page number=64), a read threshold of $(-\frac{1}{3} \times 64) + 11 = -21\frac{1}{3} + 11 = -10\frac{1}{3}$ is generated. This corresponds to a difference in read thresholds of $|15-10\frac{2}{3}|=4\frac{1}{3}$ for the first page and $|-16--10\frac{1}{3}|=5\frac{2}{3}$ for the last page. The tradeoff between storage and performance is therefore better when using a stored y intercept and slope than a single stored read threshold since the storage requirements of the two are roughly the same but better read thresholds are generated when using linear approximation.

In some cases, it may be sufficient to update just a stored y intercept for a given block without updating the corresponding slope. This is referred to herein as a partial update. For example, as described above, the slope of a linear estimation (e.g., linear estimation 204 in FIG. 2) tends to remain the same if the number of P/E cycles remains roughly the same. Depending upon system usage, there may be periods of time over which the number of P/E cycles does not change significantly and thus updating only the y intercept in a table or other storage may be acceptable since the slope is relatively unchanged. The following figures describe some partial update embodiments.

Figure 5A:
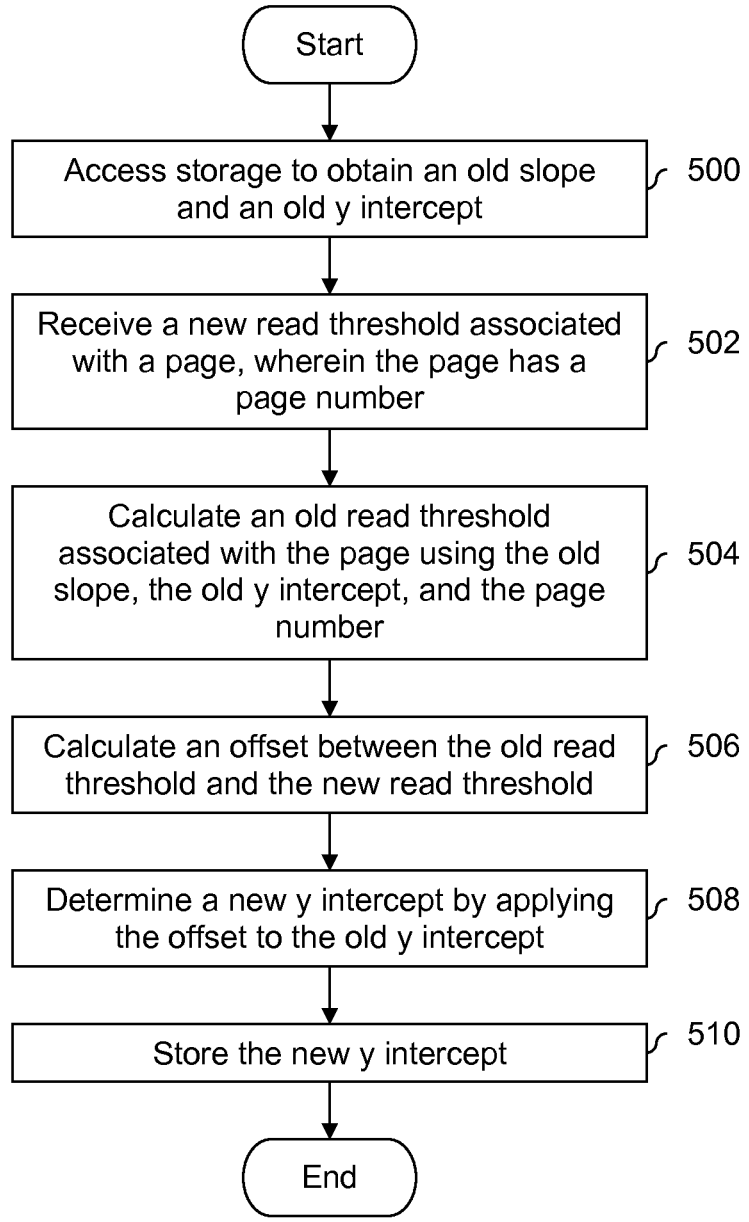
FIG. 5A is a flowchart illustrating an embodiment of a process for performing a partial update to a stored y intercept.

FIG. 5A is a flowchart illustrating an embodiment of a process for performing a partial update to a stored y intercept. In the example shown, the y intercept associated with a block is updated, but the corresponding stored slope is not updated. The sequence of steps shown in FIG. 5 is merely exemplary and some partial update embodiments may correspond to one sequence of steps while other partial update situations correspond to some other sequence of steps.

At 500, storage is accessed to obtain an old slope and an old y intercept. For example, a block identifier (e.g., B for block B) may be passed to a table and the stored slope (m) and y intercept (c) for that block are output.

At 502, a new read threshold associated with a page is received, wherein the page has a page number. In some embodiments, a new read threshold is generated using read based techniques. For example, one or more read threshold values and one or more cell read values returned by those read threshold values are analyzed. Any read threshold estimation technique other than linear estimation may be used at 502.

At 504, an old read threshold associated with the page is calculated using the old slope, the old y intercept, and the page number. For example, if the old read threshold is t, the old slope is m, the old y intercept is c, and the page number is k, then t=m×k+c.

At 506, an offset between the old read threshold and the new read threshold is calculated. For example, if the offset is $\Delta$, the new threshold is t*, and the old threshold is t, then $\Delta=t^*-t$. Note that offset may be expressed in a variety of ways and so in some embodiments $\Delta=t-t^*$ (i.e., the order is swapped).

At 508, a new y intercept is determined by applying the offset to the old y intercept. For example, if the new y intercept is c* then $c^*=c+\Delta=c+t^*-t$.

At 510, the new y intercept is stored. For example, the new y intercept overwrites the old y intercept in a table of stored y intercepts and slopes.

As with FIG. 3, a variety of triggers (e.g., time driven or event driven) may cause the process of FIG. 5A to be performed on a given block. In one example, FIG. 5A is used in an on-the-fly update. For example, a read of page k of block B in NAND memory is desired. A read processor accesses the slope and y intercept for the block from storage, and a read threshold is generated using linear estimation (see, e.g., FIG. 4). If, after reading the page using the read threshold generated using linear estimation, the read processor determines that the optimal read threshold has changed significantly and/or the quality of cell read values returned is of inferior quality, the process of FIG. 5A is initiated and some non-linear estimation technique (e.g., a read based estimation technique) is used to generate a new read threshold. This new read threshold corresponds to a new read threshold received at 502.

A full update (e.g., as shown in FIG. 3) requires more reads and more processing compared to a partial update (e.g., as in FIG. 5A). However, a complete update typically generates better quality read thresholds than a partial update. For this reason, in some situations (e.g., when read or access time and/or processing time is at a premium because the system is busy with other things), a partial update may be more desirable. In some cases, however, the quality of the read threshold generated may be so poor that a complete update is desirable and worth the additional reads and/or processing.

In some embodiments, a new y intercept determined at 508 is associated with the same block for which the offset is calculated at 506. In other cases, an offset is calculated at 506 using information from one block and the offset is reused for another block at 508. The following figures describe both such embodiments.

Figure 5B:
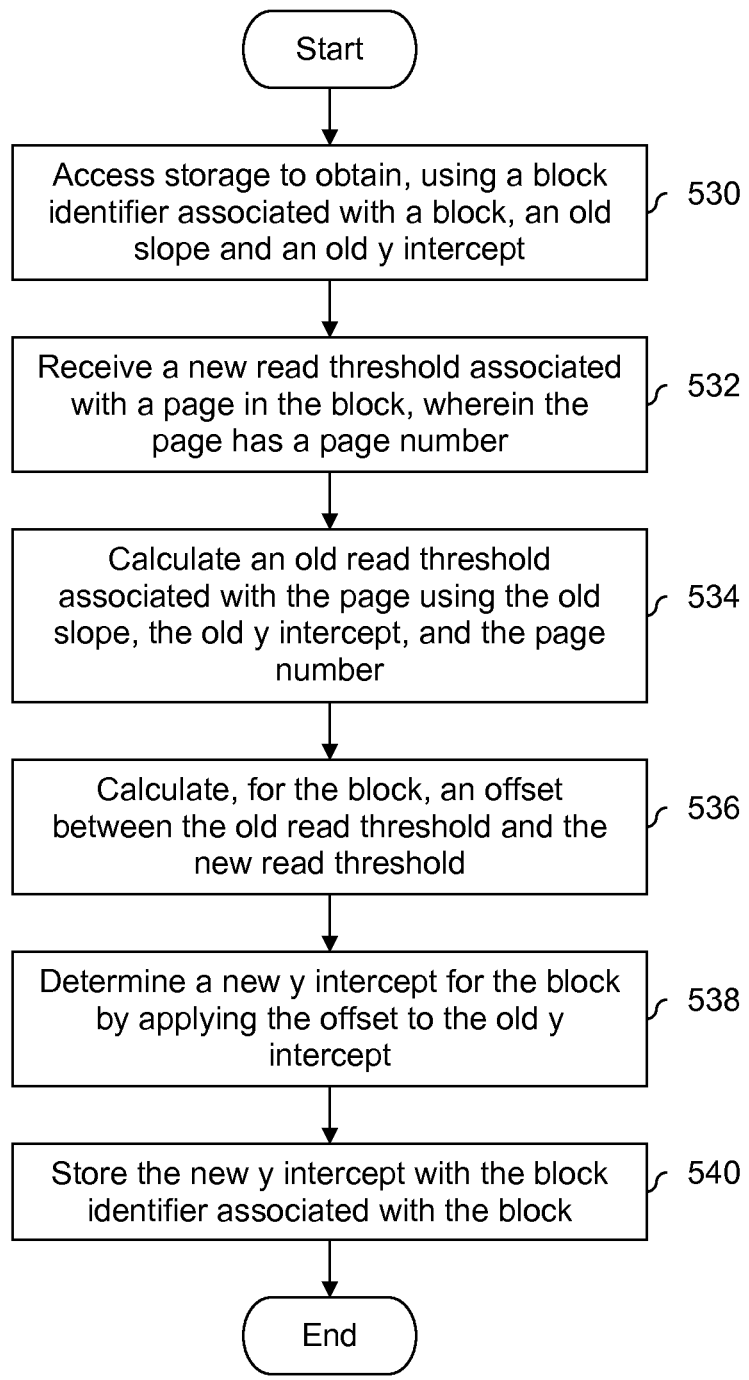
FIG. 5B is a flowchart illustrating an embodiment of a process for performing a partial update on a block using an offset associated with that block.

FIG. 5B is a flowchart illustrating an embodiment of a process for performing a partial update on a block using an offset associated with that block.

At 530, storage is accessed to obtain, using a block identifier associated with a block, an old slope and an old y intercept. For example, a block identifier for block j is passed to a table and the table returns the old slope of $m_j$ and an old y intercept of $c_j$.

At 532, a new read threshold associated with a page in the block is received, wherein the page has a page number. For example, a new read threshold of $t_j^*$ is received for page k in block j.

At 534, an old read threshold associated with the page is calculated using the old slope, the old y intercept, and the page number. For example, an old read threshold is calculated using $t_j=m_j k+c_j$.

An offset between the old read threshold and the new read threshold is calculated for the block at 536. For example, for block j, the offset is $\Delta_j=t_j^*-t_j$.

At 538, a new y intercept is determined for the block by applying the offset to the old y intercept. For example for block j, the new y intercept is $c_j^*=c_j+\Delta_j=c_j+t_j^*-t_j$. Note that the subscripts in the example above are all the same (i.e., j), indicating that the block for which a new y intercept is being calculated is the same block from which the offset is calculated.

At 540, the new y intercept is stored with the block identifier associated with the block. For example, in a table, the new y intercept is stored with the block identifier for block j, overwriting the old y intercept for block j.

Figure 5C:
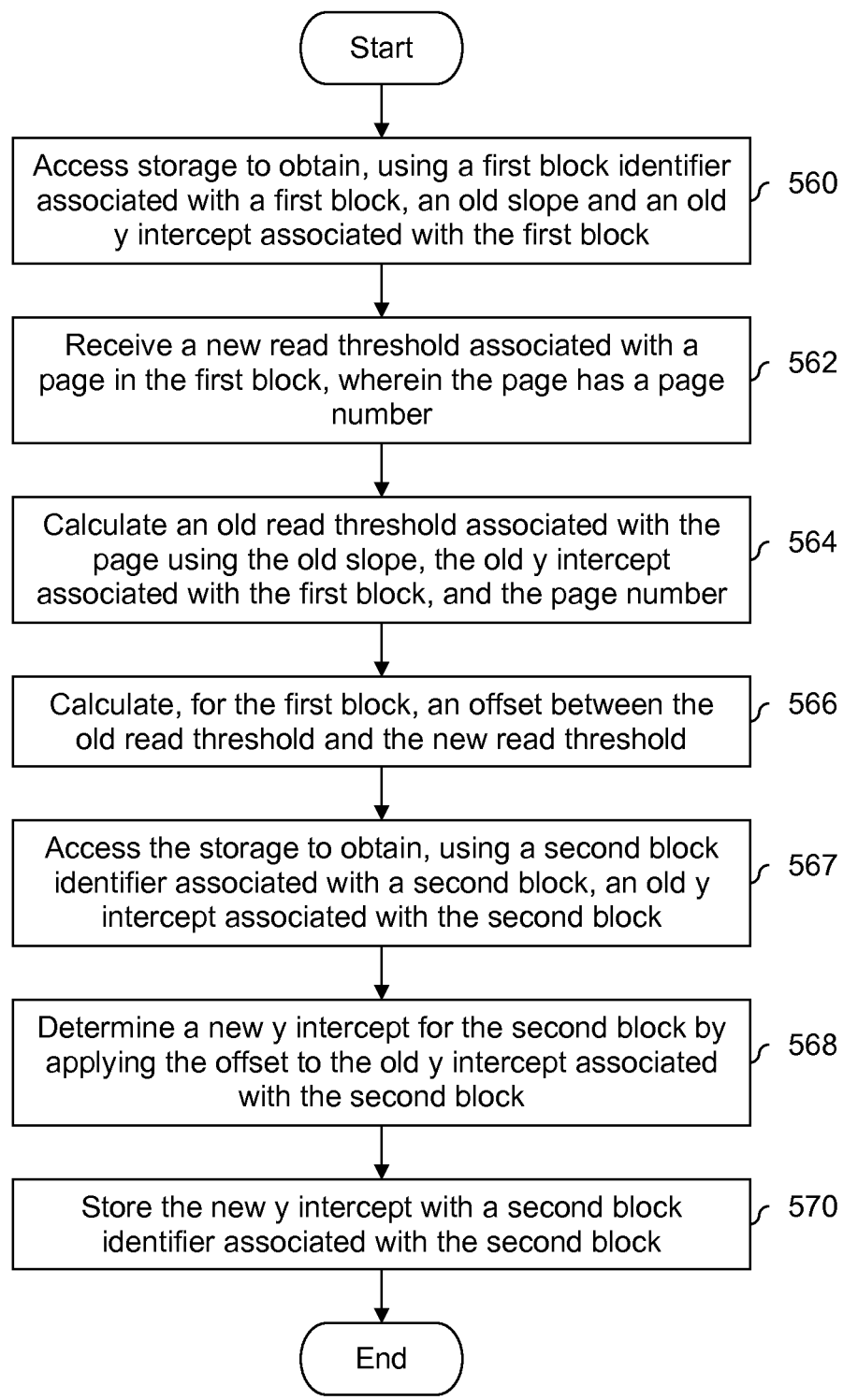
FIG. 5C is a flowchart illustrating an embodiment of a process for performing a partial update on a block using an offset associated with a different block.

FIG. 5C is a flowchart illustrating an embodiment of a process for performing a partial update on a block using an offset associated with a different block. In this example, an offset calculated using information from one block is reused to generate a new y intercept for another block.

At 560, storage is accessed to obtain, using a first block identifier associated with a first block, an old slope and an old y intercept. For example, if the first block is block j, an old slope of $m_j$ and an old y intercept of $c_j$ are obtained.

At 562, a new read threshold associated with a page in the first block is received, wherein the page has a page number. For example, for page k in block j, a new read threshold of $t_j^*$ is received.

At 564, an old read threshold associated with the page is calculated using the old slope, the old y intercept, and the page number. For page k in block j, this may be $t_j=m_j k+c_j$.

At 566, an offset between the old read threshold and the new read threshold is calculated for the first block. For example, for block j, this may be $\Delta_j=t_j^*-t_j$.

The storage is accessed to obtain, using a second block identifier associated with a second block, an old y intercept associated with the second block at 567. For example, a block identifier for a second block i is input to a table and the table outputs the y intercept for that block, $c_i$.

At 568, a new y intercept for the second block is determined by applying the offset to the old y intercept. For example, for a second block i, a new y intercept is calculated using $c_i^*=c_i+\Delta_j=c_i+t_j^*-t_j$. Note that in this example, the offset for block j is used to generate a new y intercept for block i.

At 570, the new y intercept is stored with a second block identifier associated with the second block. For example, the new y intercept may overwrite the old y intercept for the second block in a table.

Reusing an offset as opposed to calculating a new offset every time may be attractive because it is faster and/or does not consume as much power. For example, FIG. 5C does not require calculation of a read threshold for the second block. This means that a multiplication and addition are avoided. In hardware, multiplication and addition consume processing cycles and power. By avoiding these calculations, power is conserved and the amount of time to perform a partial update is reduced.

In one example of how FIG. 5C is used, the process is performed as part of an update on power up. Suppose a NAND Flash storage system is powered up after being powered down. A read of page k in block j is performed using a stored slope and y intercept and error correction decoding fails. A new read threshold is determined (e.g., using read based techniques) and a new threshold $t_j^*$ is determined. An offset for block j (i.e., $\Delta_j = t_j^* - t_j$) is applied to other blocks in a set of blocks (e.g., where the set of blocks includes all blocks in the system or only some of the blocks in the system) in order to obtain new y intercepts for the other blocks in the set.

Although some SLC examples are described above, the technique also applies to cell which store any number of bits or levels (e.g., MLC, TLC, or xLC). The following figure describes an example MLC system and demonstrates how the techniques described above are applicable to cells which store any number of bits or cells.

Figure 6:
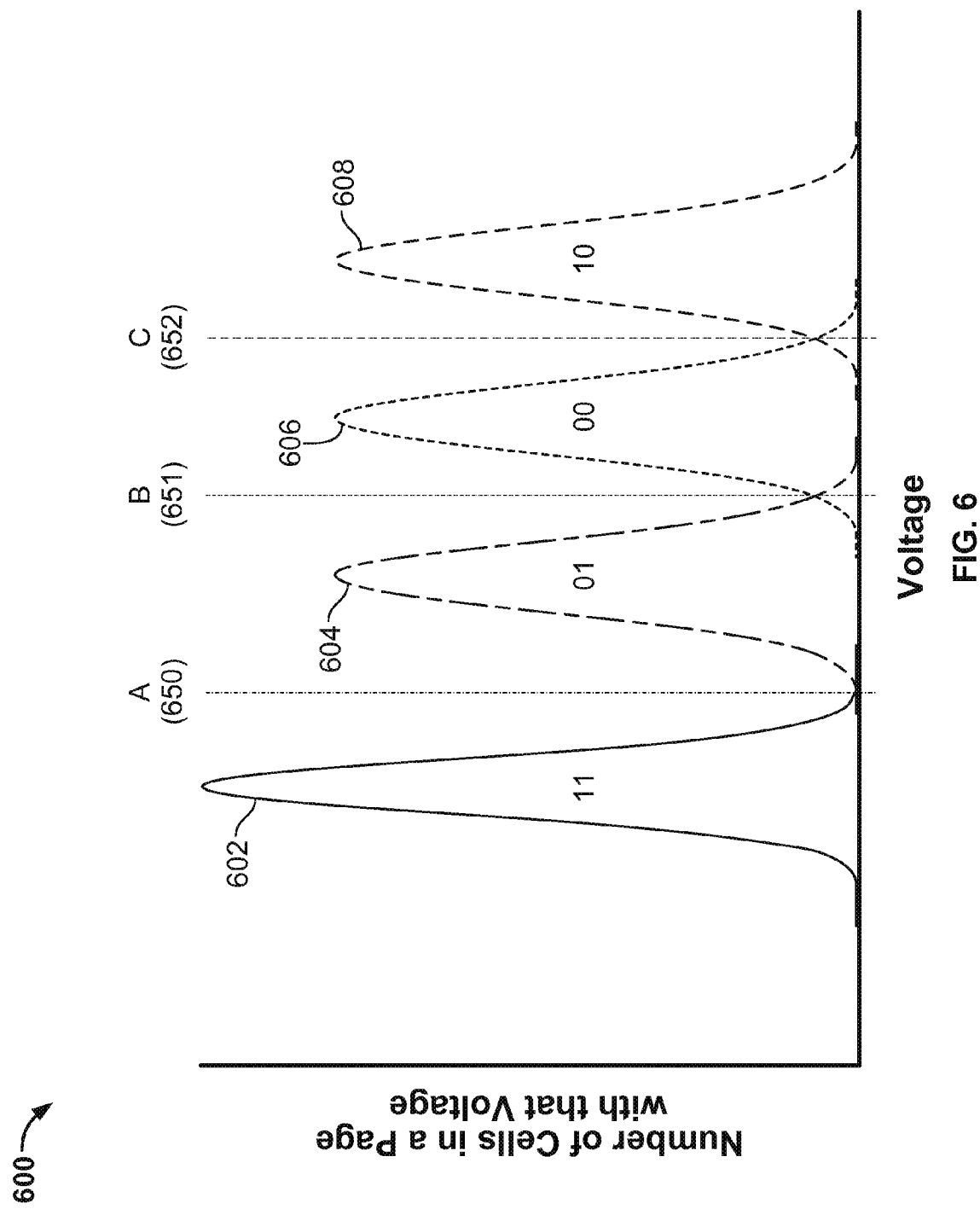
FIG. 6 is a diagram showing a MLC embodiment of distribution functions for 2-bit cells in a page.

FIG. 6 is a diagram showing a MLC embodiment of distribution functions for 2-bit cells in a page. In the example shown, diagram 600 includes 4 distributions. The cells in this example are Gray coded where distribution 602 is associated with cells in a page that (actually) store a 11, distribution 604 is associated with cells in a page that (actually) store a 01, distribution 606 is associated with cells in a page that (actually) store a 00, and distribution 608 is associated with cells in a page that (actually) store a 10.

For the 4 distributions shown, there are three read thresholds which are the optimal read thresholds to use. Read threshold 650 falls between distributions 602 and 604, read threshold 651 falls between distributions 604 and 606, and read threshold 652 falls between distributions 606 and 608.

Read thresholds A and C (650 and 652) are used to determine the most significant bit. If the stored voltage in a cell is less than A (650) or is greater than C (652), then the most significant bit is interpreted to be a 1 (i.e., 1X). If the stored voltage is between A (650) and C (652), then the most significant bit is interpreted to be a 0 (i.e., 0X). Read threshold B (651) is used to determine the least significant bit. If the stored voltage is less than B (651), then the least significant bit is interpreted to be a 1 (i.e., X1); if the stored voltage is greater than B (651), then the least significant bit is interpreted to be a 0 (i.e., X0).

In some embodiments, an individual slope and individual y intercept are determined and stored for each of read thresholds A-C (650-652). For example,

TABLE 1

Individual slopes and individual y intercepts for each of read thresholds A-C

|  | Read Threshold A | Read Threshold B | Read Threshold C |
| --- | --- | --- | --- |
| Slope | $m_A$ | $m_B$ | $m_C$ |
| Y Intercept | $c_A$ | $c_B$ | $c_C$ |

Alternatively, in some embodiments, the same slope is determined and stored for all thresholds:

TABLE 2

A shared slope and individual y intercepts for read thresholds A-C

|  | Read Threshold A | Read Threshold B | Read Threshold C |
| --- | --- | --- | --- |
| Slope |  | m |  |
| Y Intercept | $c_A$ | $c_B$ | $c_C$ |

In one example, a partial update is performed on the y intercepts in Table 1 or Table 2. As stored data ages, the A-C read thresholds for a page decrease by approximately the same amount. With this observation, the following on the fly partial update for MLC systems is performed in some embodiments. An optimal read threshold for a given page and threshold is obtained, for example for read threshold B (651) in FIG. 6. An offset is determined for that read threshold (e.g., $\Delta_B = t_B^* - t_B$) and the offset is applied to y intercepts for other read thresholds (e.g., $c_A^*$ and $c_C^*$) to obtain new y intercepts for those other read thresholds. For example:

$$c_A^* = c_A + \Delta_B = c_A + t_B^* - t_B$$

$$c_C^* = c_C + \Delta_B = c_C + t_B^* - t_B$$

in addition to $c_B^* = c_B + \Delta_B = c_B + t_B^* - t_B$.

The new y intercepts are then stored (e.g., in Table 1 or Table 2). As demonstrated above, the examples and processes described above are applicable to MLC, TLC, or xLC systems in addition to SLC systems.

Figure 7:
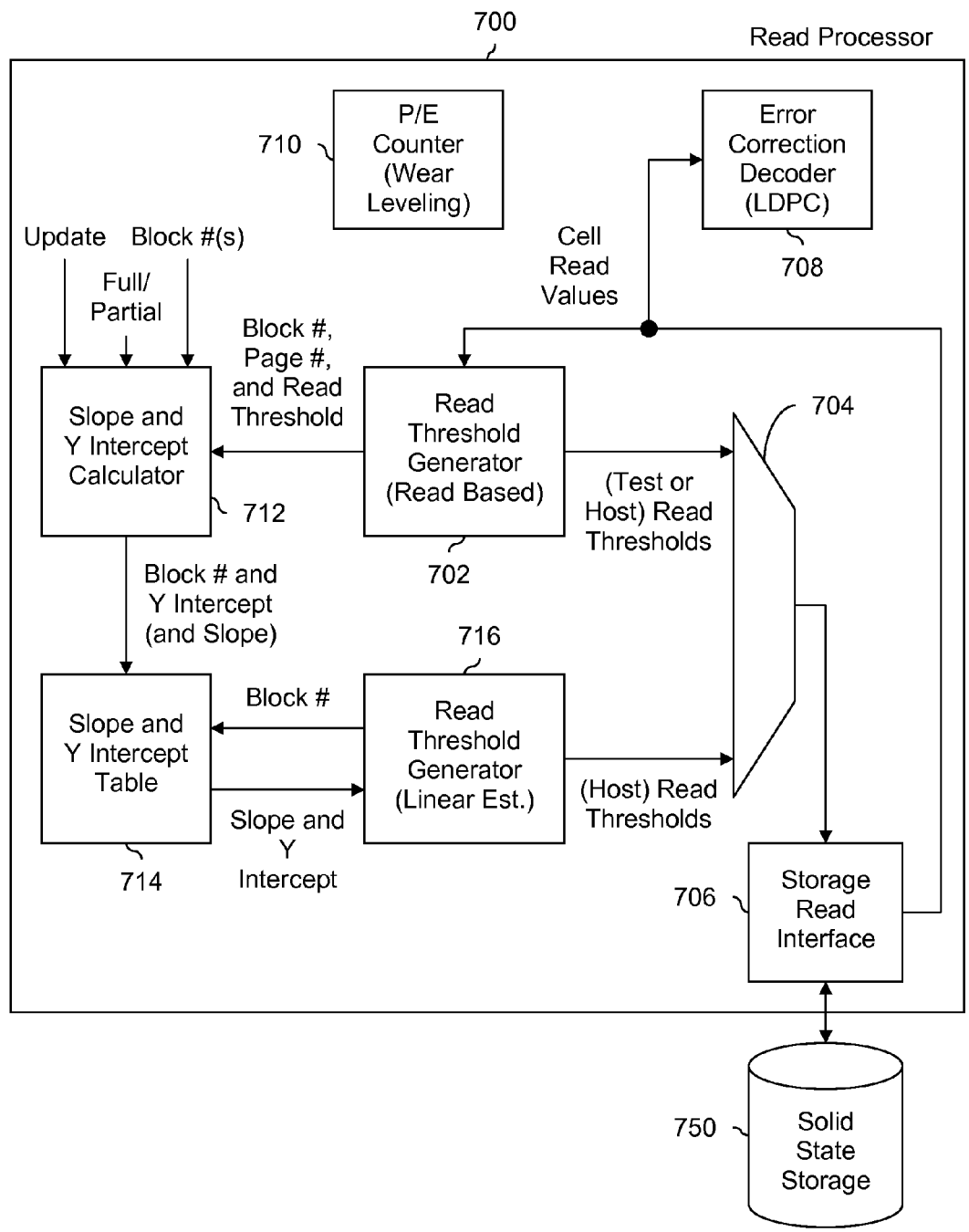
FIG. 7 is a diagram showing an embodiment of a system which is configured to store y intercepts and slopes and use the stored values to generate read thresholds.

FIG. 7 is a diagram showing an embodiment of a system which is configured to store y intercepts and slopes and use the stored values to generate read thresholds. For clarity, an SLC example is shown, but a corresponding MLC, TLC, or xLC system is similar (e.g., with the addition of signals to distinguish between the various read thresholds). In some embodiments, read processor 700 includes or is implemented on a semiconductor device, such as a field-programmable gate array (FPGA) or an application-specific integrated circuit (ASIC). To clearly describe the technique, some components (such as a corresponding write processor) are not shown in this diagram. This is not intended to be limiting and systems which perform the techniques described herein may include components not shown in this diagram (e.g., a write processor).

Read threshold generator 702 generates read thresholds using a read based technique. In general, this means passing read thresholds to storage read interface 706 via multiplexer 704 and analyzing the cell read values returned from solid state storage 750 via storage read interface 706. The read thresholds output by read threshold generator 702 may be a test read threshold (e.g., there was no request from a higher level entity, such as host, to perform a read and the purpose of this read is to obtain more cell read values to analyze), or may be a host read threshold where a host or other higher level entity requested a read. Based on this analysis of the stimuli (i.e., the test or host read thresholds) and the results returned (i.e., the cell read values), read threshold generator 702 outputs a block number, a page number, and a read threshold for that block and page. The linear estimation technique described herein is independent of the technique implemented by read threshold generator 702; read threshold generator 702 may implement any technique other than linear estimation.

Slope and y intercept calculator 712 has three control signals: update, full/partial, and block number(s). Update is asserted when an update to some information in table 714 is desired. The block number(s) indicate which blocks should be updated and the full/partial signal is used to indicate whether a full update (e.g., of both the slope and y intercept) is to be performed or if a partial update (e.g., of only the y intercept) is to be performed. In various embodiments, slope and y intercept calculator 712 performs various steps in FIGS. 3 and 5A-5C. As described above, additional signals (e.g., to differentiate between thresholds in an xLC or MLC system) may be added in an xLC or MLC system.

In various embodiments, the update signal input to slope and y intercept calculator 712 is asserted. In some cases, the update signal is asserted when the P/E count in P/E counter 710 reaches a certain count. In some embodiments, a P/E counter is part of a wear leveling block which works to make sure the number of program and erase cycles are roughly identical for all blocks in the NAND Flash storage. In some embodiments, the update signal is asserted when error correction decoder 708 fails to decode cell read values, takes too long to decode, and/or detects too many bit errors. In some embodiments, error correction decoder 708 is a low-density parity check (LDPC) decoder. In some embodiments, the update signal is asserted after a power down and power up.

Slope and y intercept calculator 712 outputs to slope and y intercept table 714 a block number, a new y intercept to store, and (in full update cases) a new slope to store. In some embodiments, a write enable signal (not shown) from calculator 712 to table 714 is asserted at an appropriate time. In some embodiments, calculator 712 and table 714 have signals between them (not shown) associated with calculator 712 performing a read of table 714 (e.g., read enable, block number, a returned slope, a returned y intercept, etc.). As is shown in FIGS. 5A-5C, an old y intercept and old y slope may be used in calculations performed by calculator 712 and therefore calculator 712 performs a read of table 714. In some embodiments, table 714 is implemented using non-volatile memory.

Read threshold generator 716 uses linear estimation to generate read thresholds. For example, read threshold generator 716 performs the process described in FIG. 4. To obtain the slope and y intercept for a given block, the block number is passed from read threshold generator 716 to table 714, and the associated slope and y intercept are returned. Since read threshold generator 716 does not use read based techniques to generate a read threshold, the read thresholds output are typically associated with host read (e.g., they were requested by a host).

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method, comprising:
receiving a first read threshold associated with a first page in a block and a second read threshold associated with a second page in the block, wherein the first page has a first page number and the second page has a second page number;
using a processor to determine a slope and a y intercept based at least in part on the first read threshold, the second read threshold, the first page number, and the second page number; and
storing, in storage, the slope and the y intercept with a block identifier associated with the block.

2. The method of claim 1, wherein the processor includes a semiconductor device, including one or more of the following: a field-programmable gate array (FPGA) or an application-specific integrated circuit (ASIC).

3. The method of claim 1, wherein the storage includes one or more of the following: a table or non-volatile storage.

4. The method of claim 1, wherein the block is associated with one or more of the following: a multi level cell (MLC) system, a tri level cell (TLC) system, or an xLC system.

5. The method of claim 4, wherein:
the y intercept is associated with a most significant bit; and
the method further includes:
using the processor to determine a y intercept associated with a least significant bit; and
storing, in the storage, the y intercept associated with the least significant bit.

6. The method of claim 5, wherein:
the slope is associated with the most significant bit; and
the method further includes:
using the processor to determine a slope associated with the least significant bit; and
storing, in the storage, the slope associated with the least significant bit.

7. A method, comprising:
receiving an indication associated with reading a page in a block, wherein the page has a page number and the block has a block identifier;
accessing storage to obtain, using the block identifier, a slope and a y intercept associated with the block;
using a processor to generate a read threshold associated with the page based at least in part on the page number, the slope, and the y intercept; and
reading the page in the block using the generated read threshold.

8. The method of claim 7, wherein the processor includes a semiconductor device, including one or more of the following: a field-programmable gate array (FPGA) or an application-specific integrated circuit (ASIC).

9. The method of claim 7, wherein the storage includes one or more of the following: a table or non-volatile storage.

10. The method of claim 7, wherein the block is associated with one or more of the following: a multi level cell (MLC) system, a tri level cell (TLC) system, or an xLC system.

11. The method of claim 10, wherein:
the read threshold and the y intercept are associated with a most significant bit; and
the method further includes:
using the processor to generate a read threshold associated with a least significant bit based at least in part on the page number and a y intercept associated with the least significant bit; and
storing, in the storage, the y intercept associated with the least significant bit.

12. The method of claim 11, wherein:
the slope is associated with the most significant bit; and
using the processor to generate the read threshold associated with the least significant bit is further based at least in part on a slope associated with the least significant bit.

13. A method, comprising:
accessing storage to obtain an old slope and an old y intercept;
receiving a new read threshold associated with a page, wherein the page has a page number;
using a processor to calculate an old read threshold associated with the page using the old slope, the old y intercept, and the page number;
using the processor to calculate an offset between the old read threshold and the new read threshold;
using the processor to determine a new y intercept by applying the offset to the old y intercept; and
storing, in the storage, the new y intercept.

14. The method of claim 13, wherein the processor includes a semiconductor device, including one or more of the following: a field-programmable gate array (FPGA) or an application-specific integrated circuit (ASIC).

15. The method of claim 13, wherein the storage includes one or more of the following: a table or non-volatile storage.

16. The method of claim 13, wherein the block is associated with one or more of the following: a multi level cell (MLC) system, a tri level cell (TLC) system, or an xLC system.

17. The method of claim 16, wherein:
the old y intercept and the new y intercept are associated with a most significant bit; and
the method further includes:
using the processor to determine a new y intercept associated with a least significant bit by applying the offset to an old y intercept associated with the least significant bit; and
storing, in the storage, the new y intercept associated with the least significant bit.

18. The method of claim 13, wherein the block for which the offset is calculated is the same block for which the new y intercept is determined.

19. The method of claim 13, wherein:
the method further includes accessing the storage to obtain, using a second block identifier associated with a second block, an old y intercept associated with the second block;
calculating the offset includes calculating, for the first block, the offset between the old read threshold and the new read threshold; and
determining the new y intercept includes determining the new y intercept for the second block by applying the offset to the old y intercept associated with the second block.

20. A computer program product, the computer program product being embodied in a non-transitory tangible computer readable storage medium and comprising computer instructions for:
receiving a first read threshold associated with a first page in a block and a second read threshold associated with a second page in the block, wherein the first page has a first page number and the second page has a second page number;
determining a slope and a y intercept based at least in part on the first read threshold, the second read threshold, the first page number, and the second page number; and
storing, in storage, the slope and the y intercept with a block identifier associated with the block.

21. A computer program product, the computer program product being embodied in a non-transitory tangible computer readable storage medium and comprising computer instructions for:
receiving an indication associated with reading a page in a block, wherein the page has a page number and the block has a block identifier;
accessing storage to obtain, using the block identifier, a slope and a y intercept associated with the block;
generating a read threshold associated with the page based at least in part on the page number, the slope, and the y intercept; and
reading the page in the block using the generated read threshold.

22. A computer program product, the computer program product being embodied in a non-transitory tangible computer readable storage medium and comprising computer instructions for:
accessing storage to obtain an old slope and an old y intercept;
receiving a new read threshold associated with a page, wherein the page has a page number;
calculating an old read threshold associated with the page using the old slope, the old y intercept, and the page number;
calculating an offset between the old read threshold and the new read threshold;
determining a new y intercept by applying the offset to the old y intercept; and
storing, in the storage, the new y intercept.

* * * * *